United States Patent
Chang et al.

(10) Patent No.: US 9,502,370 B2
(45) Date of Patent: Nov. 22, 2016

(54) SEMICONDUCTOR BONDING STRUCTURE AND PROCESS

(71) Applicant: Taiwan Semiconductor Manufacturing Company, Ltd., Hsin-Chu (TW)

(72) Inventors: Kuei-Sung Chang, Kaohsiung (TW); Nien-Tsung Tsai, Hsin-Chu (TW); Ting-Hau Wu, Yilan (TW); Yi Heng Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/040,861

(22) Filed: Feb. 10, 2016

(65) Prior Publication Data

US 2016/0163670 A1    Jun. 9, 2016

Related U.S. Application Data (63) Continuation of application No. 14/531,878, filed on Nov. 3, 2014, now Pat. No. 9,281,287, which is a continuation of application No. 13/660,374, filed on Oct. 25, 2012, now Pat. No. 8,878,355.

(51) Int. Cl.
*H01L 23/00* (2006.01)
*H01L 25/00* (2006.01)
*H01L 25/065* (2006.01)

(52) U.S. Cl.
CPC ............... *H01L 24/29* (2013.01); *H01L 24/05* (2013.01); *H01L 24/32* (2013.01); *H01L 24/83* (2013.01); *H01L 25/0657* (2013.01); *H01L 25/50* (2013.01); *H01L 2224/05082* (2013.01); *H01L 2224/26145* (2013.01); *H01L 2224/2745* (2013.01); *H01L 2224/291* (2013.01); *H01L 2224/29011* (2013.01); *H01L 2224/29012* (2013.01); *H01L 2224/29013* (2013.01); *H01L 2224/29036* (2013.01); *H01L 2224/29078* (2013.01); *H01L 2224/29124* (2013.01); *H01L 2224/29144* (2013.01); *H01L 2224/29147* (2013.01); *H01L 2224/29193* (2013.01); *H01L 2224/32506* (2013.01); *H01L 2224/83097* (2013.01); *H01L 2224/83193* (2013.01); *H01L 2224/83194* (2013.01);*H01L 2224/83203* (2013.01); *H01L 2224/83805* (2013.01); *H01L 2225/06513* (2013.01); *H01L 2924/01013* (2013.01); *H01L 2924/01014* (2013.01); *H01L 2924/01079* (2013.01); *H01L 2924/01322* (2013.01)

(58) Field of Classification Search
CPC .................... H01L 2224/97; H01L 2224/133; H01L 2224/29144; H01L 2224/83815
See application file for complete search history.

(56) References Cited

U.S. PATENT DOCUMENTS 7,282,393 B2    10/2007    Tarn
2003/0017654 A1    1/2003    Iwamoto
(Continued)

FOREIGN PATENT DOCUMENTS

WO    2011057850    5/2011

*Primary Examiner* — Karen Kusumakar
(74) *Attorney, Agent, or Firm* — Slater Matsil, LLP (57) ABSTRACT

A system and method for bonding semiconductor devices is provided. An embodiment comprises halting the flow of a eutectic bonding material by providing additional material of one of the reactants in a grid pattern, such that, as the eutectic material flows into the additional material, the additional material will change the composition of the flowing eutectic material and solidify the material, thereby stopping the flow. Other embodiments provide for additional layouts to put the additional material into the path of the flowing eutectic material.

20 Claims, 7 Drawing Sheets

(56) References Cited

U.S. PATENT DOCUMENTS

| | | |
|---|---|---|
| 2004/0007384 A1 | 1/2004 | Soga et al. |
| 2007/0090725 A1 | 4/2007 | Kamiyama et al. |
| 2007/0093229 A1 | 4/2007 | Yamakawa et al. |
| 2008/0067652 A1 | 3/2008 | Menard et al. |
| 2011/0236659 A1 | 9/2011 | Fujii et al. |
| 2012/0086127 A1* | 4/2012 | Shu .................. B81C 1/00238 257/773 |
| 2012/0280409 A1 | 11/2012 | Trautmann et al. |

\* cited by examiner

SEMICONDUCTOR BONDING STRUCTURE AND PROCESS

PRIORITY CLAIM AND CROSS-REFERENCE

This application is a continuation of U.S. patent application Ser. No. 14/531,878, filed Nov. 3, 2014, and entitled "Semiconductor Bonding Structure and Process," which is a continuation of U.S. patent application Ser. No. 13/660,374, filed Oct. 25, 2012, now U.S. Pat. No. 8,878,355, and entitled "Semiconductor Bonding Structure and Process," which applications are hereby incorporated herein by reference.

BACKGROUND

Generally, a first semiconductor device with a particular functionality may be utilized with a second semiconductor device that may have a different, yet complementary, functionality in order to obtain the benefits from both the first semiconductor device and the second semiconductor device. Alternatively, a substrate such as a printed circuit board or interposer may be utilized to help provide connectivity and support to the first semiconductor device. These devices may be physically and electrically connected to each other using a physical and electrical bonding technique.

Such bonding techniques serve a dual purpose. In a first purpose any material chosen to help bond the first semiconductor device to the second semiconductor device provides an electrically conductive path between electrical connections on the first semiconductor device and the second semiconductor device. As such, the material chosen conducts electricity and also forms an electrical bridge between the electrical connections.

In the other purpose the material chosen to bond the first semiconductor device to the second semiconductor device provides a level of physical connection between the first semiconductor device and the second semiconductor device. Without such a physical connection, the first semiconductor device may not be fully supported in relation to its positions with the second semiconductor device. As such, during movement or even during normal operation and use the first semiconductor device may shift its position, causing the alignment of the electrical connections on the first semiconductor device and the electrical connections on the second semiconductor device to shift and potentially causing the electrical connections to become unconnected, leading to an inability of the first semiconductor device and the second semiconductor device to exchange electrical signals with each other.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a eutectic bonding of two semiconductor devices. Other embodiments may also be applied, however, to other bonding processes.

Figure 1A:
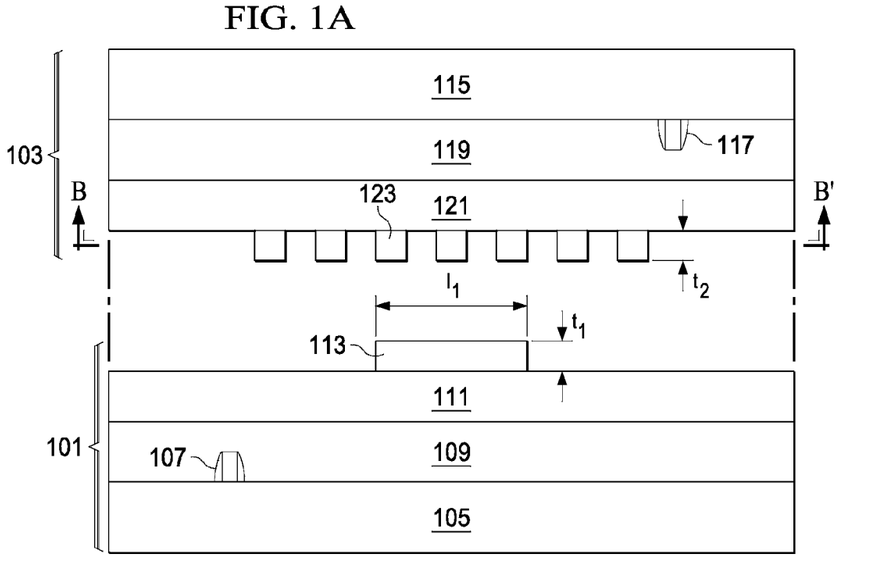
FIGS. 1A-1B illustrate a first semiconductor device and a second semiconductor device to be bonded in accordance with an embodiment.

With reference now to FIG. 1A, there is shown a first semiconductor device 101 and a second semiconductor device 103 that will be bonded to the first semiconductor device 101. In an embodiment the first semiconductor device 101 may be a semiconductor die with functional circuitry designed to provide a desired functionality while the second semiconductor device 103 may also be a semiconductor die with functional circuitry designed to work with or complement the functionality of the first semiconductor device 101. Alternatively, one of the first semiconductor device 101 and the second semiconductor device 103 may comprise functional circuitry, while the other one provides additional connectivity and routing, such as being an interposer or other type of packaging. Any suitable combination of devices that may be electrically or physically bonded together are fully intended to be included within the scope of the embodiments.

The first semiconductor device 101 may comprise a first substrate 105, first active devices 107, first metallization layers 109, a first passivation layer 111, and a first bonding material 113. The first substrate 105 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, interposer substrates or organic substrates may also be included within the scope.

The first active devices 107 (only one of which is illustrated in FIG. 1A for clarity) may be formed on the first substrate 105. As one of ordinary skill in the art will recognize, the first active devices 107 may include a wide variety of active and passive devices such as capacitors, resistors, inductors and the like may be used to generate the desired structural and functional requirements of the design for the first semiconductor device 101. The first active devices 107 may be formed using any suitable methods either within or else on the surface of the first substrate 105.

The first metallization layers 109 may be formed over the first substrate 105 and the first active devices 107 and are designed to connect the various active devices 107 to form functional circuitry. While illustrated in FIG. 1A as a single layer, the first metallization layers 109 may be formed of alternating layers of dielectric (e.g., low-k dielectric material) and conductive material (e.g., copper) and may be formed through any suitable processes (such as deposition, damascene, dual damascene, etc.). In an embodiment there may be four layers of metallization separated from the first substrate 105 by at least one interlayer dielectric layer (ILD), but the precise number of first metallization layers 109 is dependent upon the design of the first semiconductor device 101.

The first passivation layer 111 may be formed on the first substrate 105 over the first metallization layers 109. The first passivation layer 111 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 111 may be formed through a process such as chemical vapor deposition (CVD), although any suitable process may be utilized, and may have a thickness between about 0.5 μm and about 5 μm, such as about 9.25 KÅ.

The first bonding material 113 may be formed over and through the first passivation layer 111 in order to provide an electrical connection between the first metallization layers 109 and the second semiconductor device 103 (the bonding process is described further below with respect to FIGS. 2A-3B). In an embodiment the first bonding material 113 may be utilized along with a second bonding material 123 (described further below) in order to form a eutectic bond between the first bonding material 113 and the second bonding material 123. This bonding may be utilized to provide the physical and electrical bonds between the first semiconductor device 101 and the second semiconductor device 103.

As such, the material utilized for the first bonding material 113 is complementary to the material utilized for the second bonding material 123 to obtain a eutectic bond. As such, while the precise materials chosen for the first bonding material 113 is dependent at least in part on the material chosen for the second bonding material 123, in an embodiment in which the second bonding material 123 is chosen to be aluminum, the first bonding material 113 may be a eutectic bonding material such as germanium or silicon. However, if the second bonding material 123 is germanium, the first bonding material 113 may be aluminum. Alternatively, in an embodiment in which the second bonding material 123 is silicon, the first bonding material 113 may be aluminum or gold. Any suitable combination of materials for the first bonding material 113 and the second bonding material 123 that will form a eutectic bond may alternatively be utilized, and all such combinations are fully intended to be included within the scope of the embodiments. The first bonding material 113 may be formed using physical vapor deposition (PVD) or chemical vapor deposition (CVD), although any other suitable process may alternatively be utilized.

The first bonding material 113 may be one or more layers of materials, and may be sized and shaped to provide enough of the first bonding material 113 to react with a portion of a second bonding material 123 located on the second semiconductor device 103 (as described further below with respect to FIGS. 2A-3B). Additionally, in an embodiment the second bonding material 123 is patterned such that individual patterns in the second bonding material 123 are not enough form a eutectic compound with the first bonding material 113. As such, the reaction between the first bonding material 113 and the second bonding material 123 will be reactant limited as a eutectic product of the reaction begins to spread. By limiting the reaction that produces the eutectic product, the lateral spread of the eutectic product will also be limited, thereby preventing the spread of the eutectic product any limiting any undesired electrical shorts from forming.

As such, while the precise dimensions of the first bonding material 113 may be determined in part based upon the material and amount of the second bonding material 123, in an embodiment in which the second bonding material 123 is aluminum and shaped as discussed below, the first bonding material 113 may be formed in a block shape with a first length $l_1$ of between about 2 μm and about 80 μm, such as about 30 μm, and a first width $w_1$ of between about 2 μm and about 80 μm, such as about 30 μm. Additionally, the first bonding material 113 may have a first thickness $t_1$ of between about 0.1 μm and about 1 μm, such as about 0.5 μm.

The second semiconductor device 103 may comprise a second substrate 115, second active devices 117, second metallization layers 119, a second passivation layer 121, and a second bonding material 123. In an embodiment the second substrate 115, the second active devices 117, the second metallization layers 119, and the second passivation layer 121 may be similar to the first substrate 105, the first active devices 107, the first metallization layers 109, and the first passivation layer 111, respectively. Alternatively, the second substrate 115, the second active devices 117, the second metallization layers 119, and the second passivation layer 121 may be different from the first substrate 105, the first active devices 107, the first metallization layers 109, and the first passivation layer 111. Additionally, as described above, the second semiconductor device 103 may comprise no second active devices 117 and may be an interposer or other type of substrate used to provide connectivity and support to the first semiconductor device 101.

The second bonding material 123 may be one or more layers formed over and through the second passivation layer 121 in order to provide an electrical connection between the second metallization layers 119 and the first semiconductor device 101 (the bonding process is described further below with respect to FIGS. 2A-3B). In an embodiment the second bonding material 123 is a complementary material with the first bonding material 113 such that, when the two materials are mixed at an appropriate temperature and composition, a eutectic compound is formed. As such, while the precise material of the second bonding material 123 is dependent at least in part on the material chosen for the first bonding material 113, in an embodiment in which the first bonding material 113 is germanium the second bonding material 123 may be, e.g., aluminum. However, any other suitable material pairs, such as gold-gold, copper-copper, Aluminum-Aluminum, Al—Si, Au—Si, Au—Ge, or the like, may alternatively be utilized.

The second bonding material 123 may be formed using a deposition process such as chemical vapor deposition (CVD), plasma assisted chemical vapor deposition (PECVD), physical vapor deposition (PVD), combinations of these, or the like, in order to form a blanket layer (not individually illustrated in FIG. 1A) of the second bonding material 123. Once the blanket layer of the second bonding material 123 has been formed, the blanket layer of the second bonding material 123 is patterned in such a fashion as to provide an initiating amount of the second bonding material 123 and a halting amount of the second bonding material 123. In an embodiment the initiating amount is used to initiate eutectic reaction with the first bonding material 113 and, at intervals surrounding the initial amount of the second bonding material 123, the halting amount is utilized to help drive the compound out of the eutectic phase.

Figure 1B:
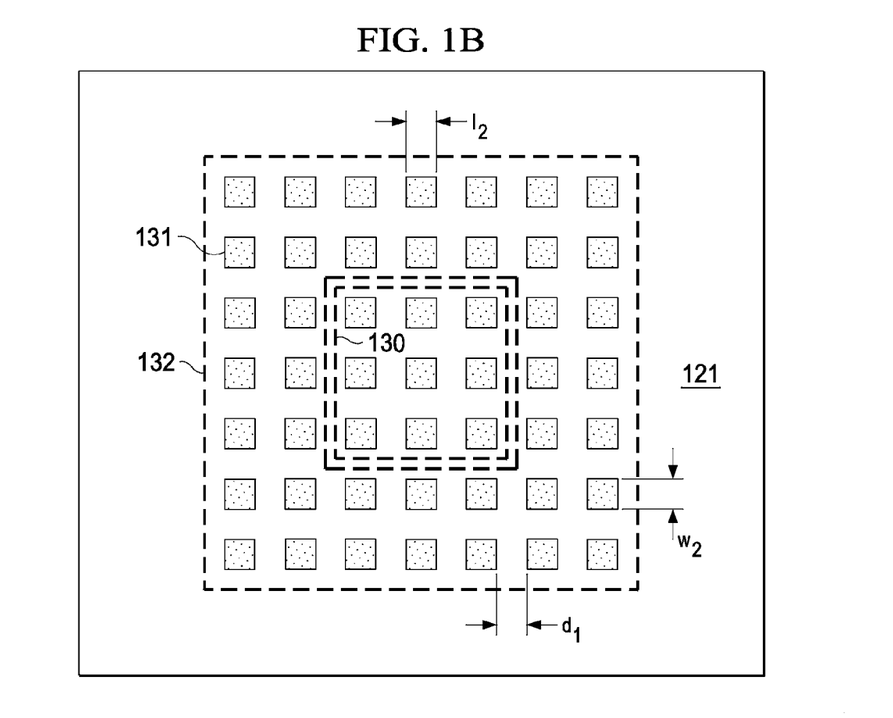

For example, FIG. 1B illustrates one embodiment of the second bonding material along line B-B' in FIG. 1A in which the second bonding material 123 is patterned in a grid pattern, with an inner initiating amount of the second bonding material 123 (represented in the dashed box labeled 130) and an outer halting amount of the second bonding material 123 (represented in the dashed box labeled 132). In this embodiment the grid pattern may be a square grid of seven individual blocks 131 of the second bonding material 123 per side of the grid.

Additionally, the individual blocks 131 are sized and shaped so that the initiating amount 130 of the second bonding material 123 provides enough of the second bonding material 123 to initiate and maintain the eutectic reaction with the first bonding material to form the eutectic product. As such, while the dimensions of the individual blocks 131 will be dependent at least in part on the size and shape of the first bonding material 113, in an embodiment in which the second bonding material 123 is aluminum the individual blocks 131 may have a second length $l_2$ of between about 0.5 µm and about 5 µm, such as about 2 µm, and a second width $w_2$ of between about 0.5 µm and about 5 µm, such as about 2 µm.

Additionally, the individual blocks 131 may have a second thickness $t_2$ (see FIG. 1A) of between about 0.1 µm and about 2 µm, such as about 1 µm, and may be spaced apart from one another a first distance $d_1$ of between about 0.5 µm and about 5 µm, such as about 2 µm. The second thickness $t_2$ may also be utilized, if desired, to precisely tune the specific amount of the second bonding material 123 that is desired. If additional second bonding material 123 is desired, for example, to modify the composition of the eutectic compound that will form, then the second thickness $t_2$ may be increased to put additional amounts of the second bonding material 123 where desired. Additionally, if less second bonding material 123 is desired, the second thickness $t_2$ may be reduced.

Figure 2A:
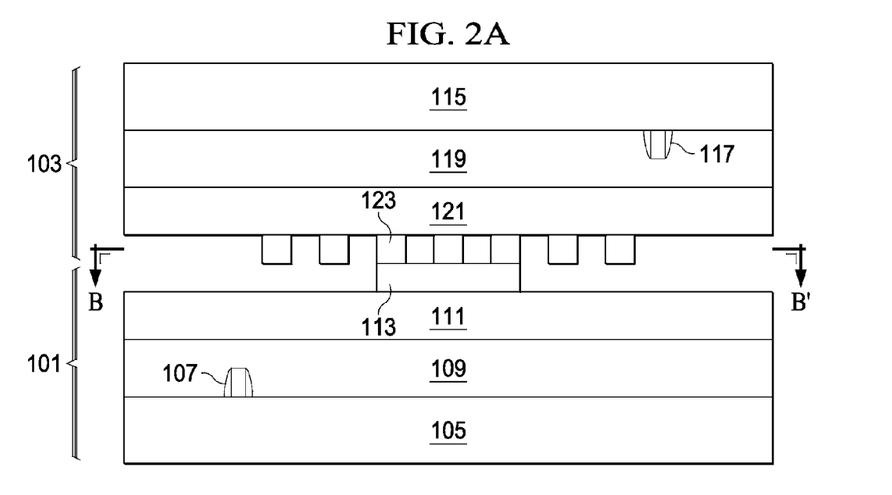
FIGS. 2A-2B illustrate contact a first bonding material with a second bonding material in accordance with an embodiment.
Figure 2B:
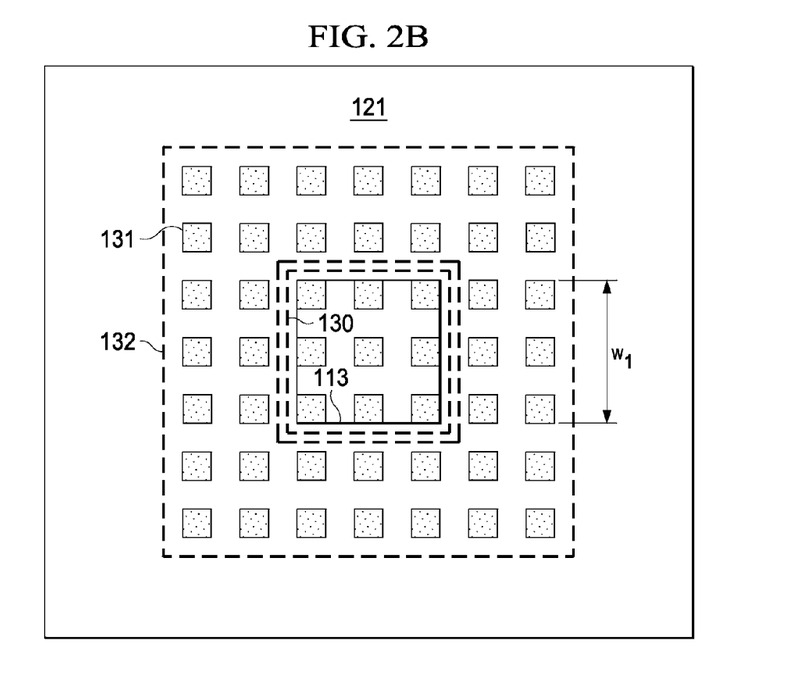

FIGS. 2A-2B illustrate a step in a bonding process whereby the first semiconductor device 101 and the second semiconductor device 103 are placed in contact with each other by placing the first bonding material 113 in contact with the initiating amount 130 of the second bonding material 123, with FIG. 2B illustrating a plan view along line B-B' in FIG. 2A. In an embodiment where eutectic bonding is desired, the first bonding material 113 (e.g., germanium) and the initiating amount 130 of the second bonding material (e.g., aluminum) may result in a composition sufficient to initiate a eutectic reaction between the first bonding material 113 and the second bonding material 123. For example, the combined materials of the first bonding material 113 and the initiating amount 130 of the second bonding material 123 may have a germanium composition of between about 25% and about 35%, such as about 28%, and may have an aluminum composition of between about 65% and about 75%, such as about 72%.

To initiate the eutectic reaction between the first bonding material 113 and the second bonding material 123, a temperature of the first bonding material 113 and the second bonding material 123 is raised to a eutectic point of the materials. As such, while the precise temperature is dependent at least in part upon the materials chosen for the first bonding material 113 and the second bonding material 123, in an embodiment in which the first bonding material 113 is germanium and the second bonding material 123 is aluminum as described above, the temperature of the first bonding material 113 and the second bonding material 123 may be increased to greater than the eutectic point of about 419° C.

When the first bonding material 113 and the second bonding material 123 are in contact with each other at the right composition and their temperature is raised past the eutectic temperature point, the first bonding material 113 and the second bonding material 123 will react and form a eutectic composition bonding material 201 in a liquid phase. This eutectic composition bonding material 201 begins to flow and provides for the electrical connection between the first semiconductor device 101 and the second semiconductor device 103.

Additionally, pressure may be added to the first bonding material 113 and the second bonding material 123 by applying one or more forces to the first semiconductor device 101 and the second semiconductor device 103. The precise pressure utilized may be dependent at least in part upon the status of the first semiconductor device 101 and the second semiconductor device 103, such as their size, bonding area, warpage, or the like. This pressure also helps to drive the eutectic reaction and helps to position the first semiconductor device 101 and the second semiconductor device 103 for the final bonding. However, as pressure is applied to the first semiconductor device 101 and the second semiconductor device 103, pressure is also applied to the eutectic composition bonding material 201 in its liquid phase, causing the eutectic composition bonding material 201 to flow in potentially uncontrollable and undesirable fashion.

Figure 3A:
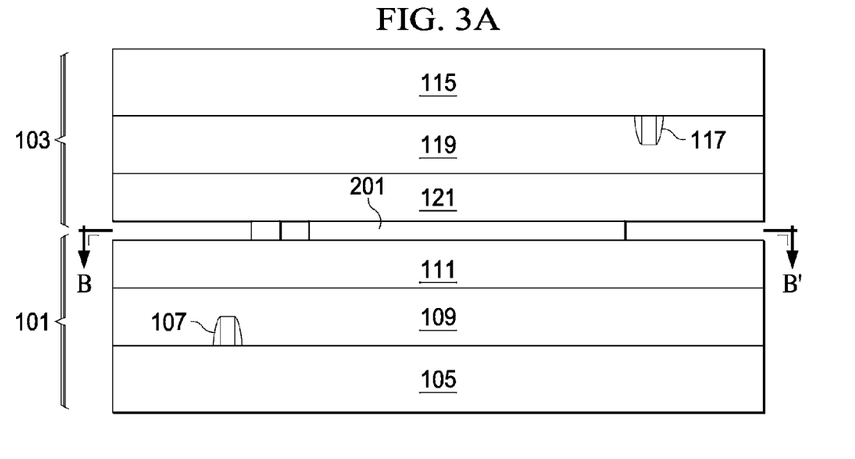
FIGS. 3A-3B illustrate halting the flow of a eutectic bonding material in accordance with an embodiment.
Figure 3B:
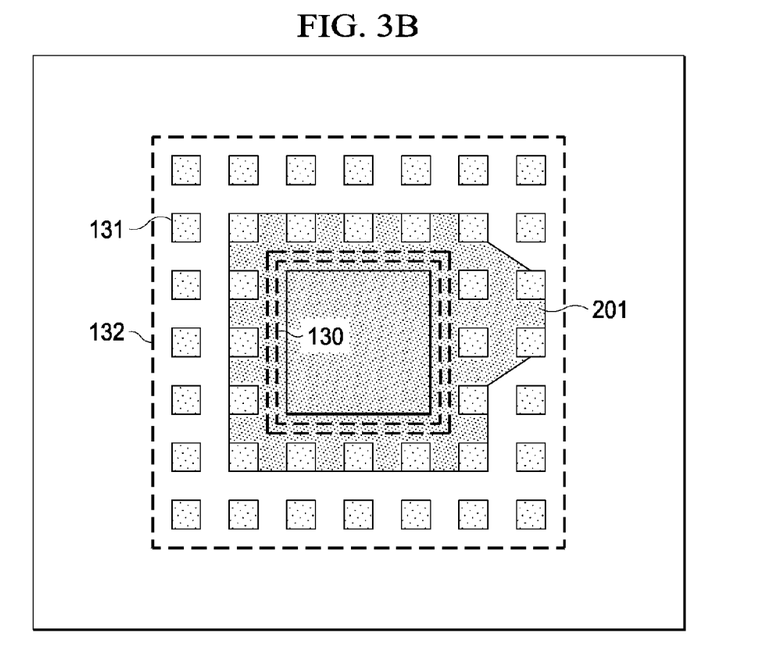

FIGS. 3A-3B illustrate an embodiment that may be used to control this flow of the eutectic composition bonding material 201. As can be seen, the eutectic composition bonding material 201, while providing for the electrical connection between the first semiconductor device 101 and the second semiconductor device 103, has also begun to flow away from its original location. If left by itself, the flow of the eutectic composition bonding material 201 (driven by the pressure from the bonding process) may extend uncontrollably to another conductive portion of either the first semiconductor device 101 or the second semiconductor device 103, thereby causing a undesired short-circuit.

To counter-act the undesired flow of the eutectic composition bonding material 201, the halting amount 132 of the second bonding material 123 is provided. As the eutectic composition bonding material 201 flows away from its initial position within the center of the grid, the eutectic composition bonding material 201 will come into contact with the individual blocks 131 that make up the halting amount 132 of the second bonding material 123 that surrounds the initial location eutectic composition bonding material 201. This contact will help to contain the flow of the eutectic composition bonding material 201.

In particular, when the eutectic composition bonding material 201 comes into contact with the individual blocks 131 of the halting amount 132 of the second bonding material 123 (e.g., aluminum), the additional second bonding material 123 present in the halting amount 132 of the second bonding material 123 will alter the composition of those portions of the eutectic composition bonding material 201 in immediate contact with the halting amount 132 of the second bonding material 123. This altering of the composition of the eutectic composition bonding material 201 will drive those portions of the eutectic composition bonding material 201 out of the composition range that forms the eutectic compound at the process temperature. This will cause those portions of the eutectic composition bonding material 201 with the additional second bonding material 123 to shift to a solid, thereby preventing the flow of the eutectic composition bonding material 201 from continuing.

Additionally, in an embodiment in which there are multiple rows of the individual blocks 131, the further away from the initial location that the eutectic composition bonding material 201 flows, the greater the number of individual blocks 131 the eutectic composition bonding material 201 will come into contact with. As such, if the eutectic composition bonding material 201 remains in the eutectic phase after contacting a first row of the individual blocks 131, the eutectic composition bonding material 201 will continue to flow and will contact another row that will add even more of the second bonding material 123 to the eutectic composition bonding material 201 and driving the eutectic composition bonding material 201 further away from the eutectic point at the temperature of the bonding process. As such, the second row (or other additional rows depending upon the number of rows utilized) will serve as a back stop to the first row.

Once the eutectic composition bonding material 201 has been used to make the electrical connection between the first semiconductor device 101 and the second semiconductor device 103, the bonding process may be continued by lowering the temperature of the eutectic composition bonding material 201 below its eutectic point. By lowering the temperature, the eutectic composition bonding material 201 will phase change back into a solid, thereby physically bonding the first semiconductor device 101 and the second semiconductor device 103. For example, while the precise temperature will be dependent at least in part on the materials and compositions chosen, in an embodiment in which the first bonding material 113 is germanium and the second bonding material 123 is aluminum in the compositions described above, the temperature of the eutectic composition bonding material 201 may be lowered below the eutectic point of about 419° C.

However, as one of ordinary skill in the art will recognize, the precise process conditions, such as the process temperature utilized during the bonding process and the reduction in process temperature utilized to change the eutectic composition back in to a solid, are at least in part dependent upon the desired compositions of the first bonding material 113 and the second bonding material 123. For example, in an embodiment in which the combination of the first bonding material 113 and the initiation portion of the second bonding material 123 has a germanium concentration of about 10 atom % and an aluminum concentration of about 90 atom %, the process temperature may need to be increased to greater than around 620° C. to reach the eutectic point and may need to be lowered below around 620° C. in order to make the eutectic composition solidify. All such variations on composition and their respective eutectic points and temperatures may alternatively be utilized, and all are fully intended to be included within the scope of the embodiments.

By using the halting amount 132 of the second bonding material 123 to help control the flow of the eutectic composition bonding material 201, the overall space required for the connection in order to make sure that there is no undesired connections may be reduced. This helps to reduce the pattern density, size and layout utilized for connecting the first semiconductor device 101 to the second semiconductor device 103, while still maintaining a lower contact resistance than by arbitrarily reducing the size of the layout. Additionally, by patterning the second bonding material 123, the pattern may also be used as a process aligner or a bonding shift monitor, thereby alleviating additional steps to form these structures independently from the second bonding material 123.

Figure 4A:
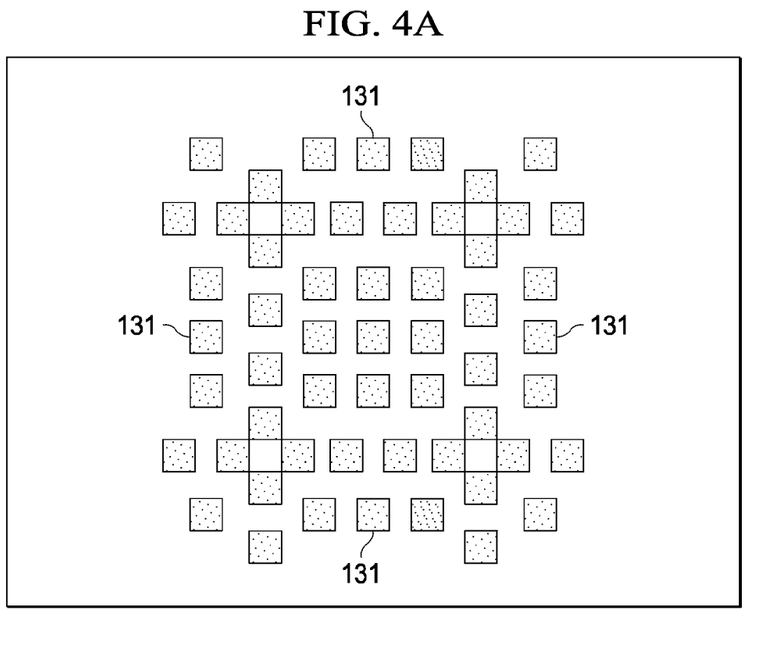
FIGS. 4A-4E illustrate patterns that may be utilized to halt the eutectic bonding material in accordance with an embodiment.

FIGS. 4A-4E illustrate that, while the grid pattern illustrated above with respect to FIG. 1B is one embodiment that may be used, such a description is not intended to limit the embodiments. Rather, a wide variety of patterns may be used to pattern the second bonding material 123 in order to provide both an initiating amount 130 of the second bonding material as well as the halting amount 132 of the second bonding material. FIG. 4A illustrates that the individual blocks 131 may be arranged so as to add more second bonding material 123 at corners of the grid pattern.

Figure 4B:
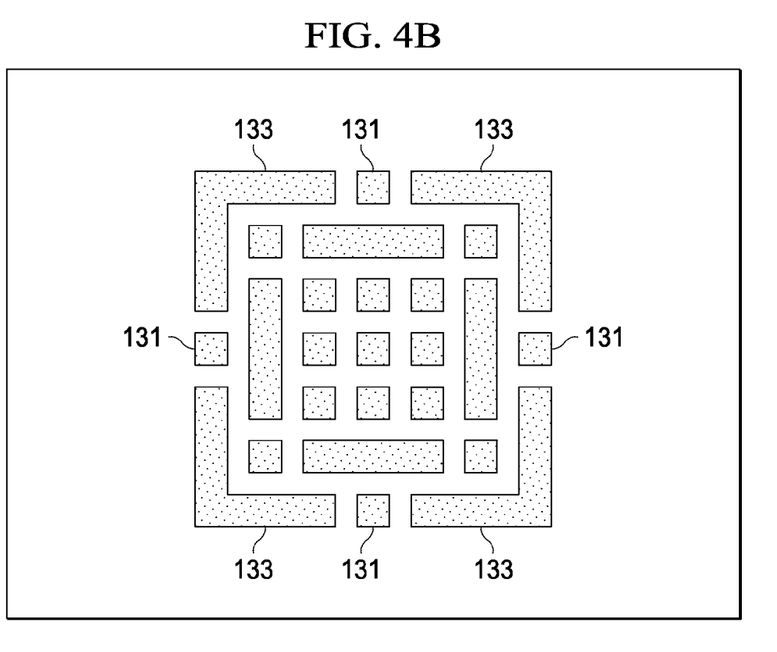

FIG. 4B illustrates that, instead of having a grid comprising similarly sized and shaped blocks 131, a series of blocks 131 and lines 133 may be utilized within the grid. By using lines 133 along with the individual blocks 131, additional halting material 131 of the second bonding material 123 may be added where desired. For example, in FIG. 4B additional material is added in lines that overlap each other along the flow path of the eutectic composition bonding material 201.

Figure 4C:
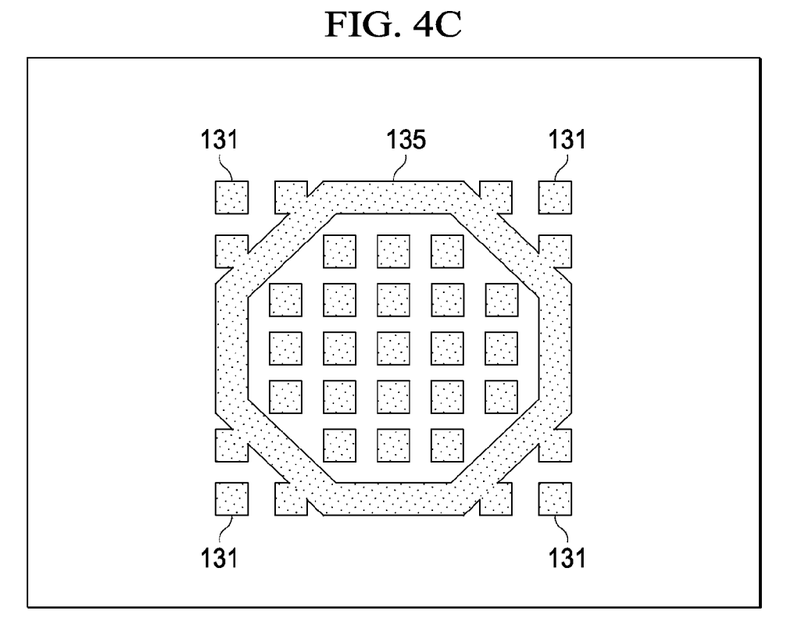

FIG. 4C illustrates that the lines 133 may be arranged in various encircling shapes 135, such as an octagonal shape illustrated in FIG. 4C. By using an encircling shape 135, the halting amount 131 of the eutectic composition bonding material 201 may, in addition to providing a halt to the eutectic reaction, may also provide a physical barrier to the flow of the eutectic composition bonding material 201 until the eutectic reaction is halted and the eutectic composition bonding material 201 resolidifies.

Figure 4D:
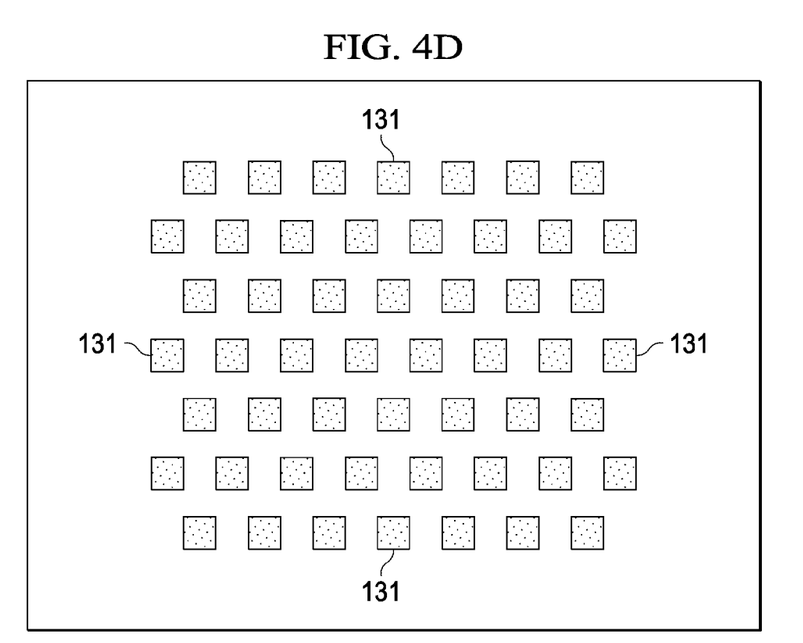

FIG. 4D illustrates a grid pattern laid out in a non-uniform manner. For example, the rows of the grid may be offset from each other. Such a pattern helps to disrupt the flow of the eutectic composition bonding material 201 and helps the eutectic composition bonding material 201 come into contact with the halting amount 131 of the second bonding material 123.

Figure 4E:
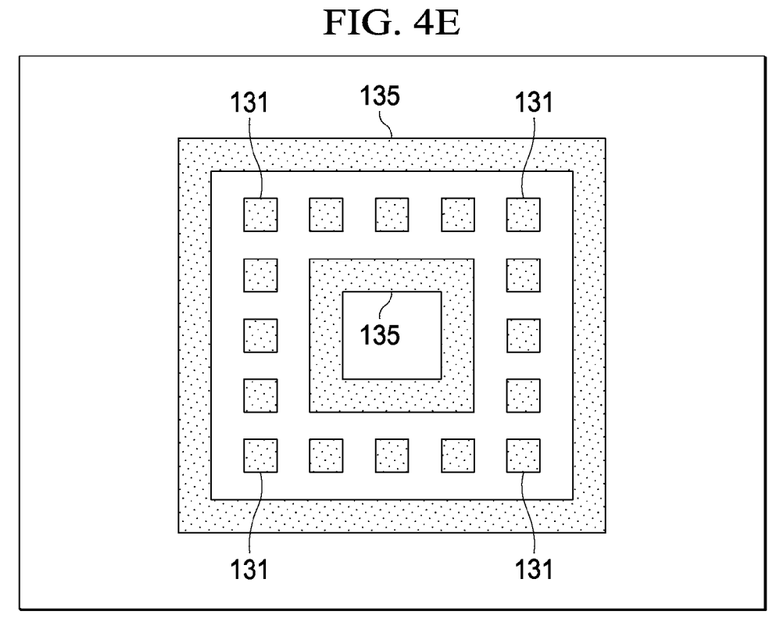

FIG. 4E illustrates yet another embodiment in which a series of encircling shapes 135 (in this embodiment in the shape of encircling rectangles) are utilized to help prevent the flow of the eutectic composition bonding material 201. By using a series of encircling shapes, one may act as a backstop to the other in case one fails.

Figure 5A:
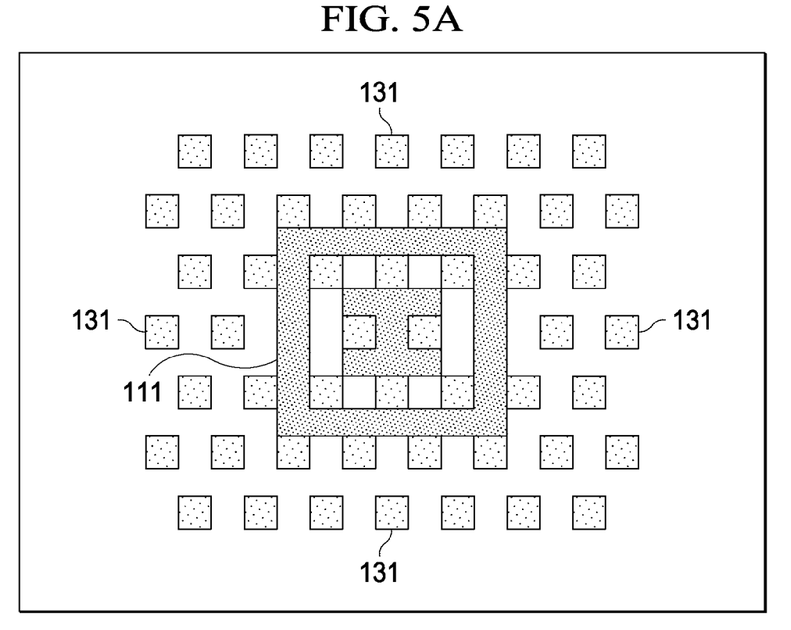
FIGS. 5A-5B illustrate patterns that may be used with the first bonding material to assist to halting the flow of the eutectic bonding material in accordance with an embodiment.
Figure 5B:
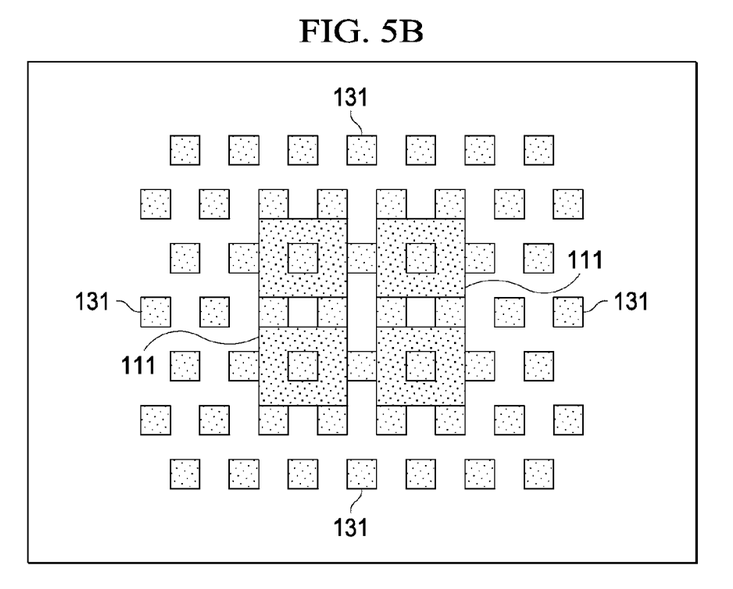

FIGS. 5A-5B illustrates another embodiment in which the second bonding material 123 is patterned (as described above with respect to FIGS. 1A-4E) and the first bonding material 113 is patterned as well. In the embodiment illustrated, the staggered grid pattern described above with respect to FIG. 4D is utilized as the pattern for the second bonding material 123. Additionally, the first bonding material is patterned, for example, into a square pattern encircling an "I" shape. Such patterning of the first bonding material 113 allows for a flow of the eutectic composition bonding material 201 both towards the center of the first bonding material 113 as well as away from the center of the first bonding material 113.

FIG. 5B illustrates another patterning of the first bonding material 113 that may be utilized. In this embodiment the first bonding material 113 is patterned into a series of square shapes set out in a two by two grid. Such a patterning allows each of the square shapes of the first bonding material 113 to flow (once it has reacted with the second bonding material 123) independently from each other until the flows come into contact.

Figure 6:
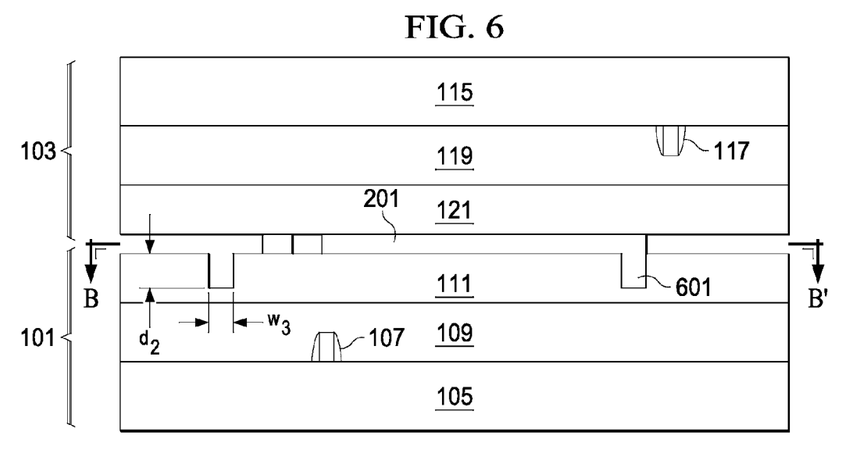
FIG. 6 illustrates trenches that may be utilized along with the patterns in accordance with an embodiment.

FIG. 6 illustrates yet another embodiment that may be used in conjunction with the initiating amount 130 and the halting amount 132 of the second bonding material 123 to help prevent undesirable flow. In this embodiment trenches 601 may be formed in either the first semiconductor device 101 (as illustrated in FIG. 6) or in both the first semiconductor device 101 and the second semiconductor device 103. These trenches 601 serve as a backstop to the halting amount 132 of the second bonding material 123 and help to contain the eutectic composition bonding material 201 in case the eutectic composition bonding material 201 gets past the halting amount of the second bonding material 123.

In an embodiment the trenches may be formed utilizing, e.g., a photolithographic masking and etching process whereby a photosensitive material (not individually illustrated) is applied to the first semiconductor device 101, exposed to a patterned energy source such as light, and developed to form a mask. Once developed, the mask is utilized to pattern the underlying first semiconductor device 101 to form the trenches 601 using, e.g., a dry etch process, although any suitable etching process may alternatively be utilized. The trenches 601 may be formed to have a third width $w_3$ of between about 0.5 μm and about 5 μm, such as about 2 μm, and may be formed to a depth of a second distance $d_2$ of between about 0.5 μm and about 40 μm, such as about 20 μm, although any suitable dimension may alternatively be utilized.

In accordance with an embodiment, a semiconductor device comprises a first substrate and a second substrate. A eutectic bonding material is interposed between the first substrate and the second substrate, the eutectic bonding material comprising an initiating portion with a first proportion of a first eutectic component and a second eutectic component and a halting portion surrounding the initiating portion, the halting portion having a second proportion of the first eutectic component and the second eutectic component that is different from the first proportion. The semiconductor device also comprises a block laterally separated from the eutectic bonding material, wherein the block comprises the first eutectic component. The eutectic bonding material bonds the first substrate and the second substrate.

In accordance with another embodiment, a semiconductor device comprises a first eutectic bonding material disposed between a first substrate and a second substrate, the first eutectic bonding material having a first composition comprising a first eutectic component and a second eutectic component. The semiconductor device also comprises a second eutectic bonding material adjacent the first eutectic bonding material, the second eutectic bonding material having a second composition comprising the first eutectic component and the second eutectic component, wherein the second composition is different from the first composition. The semiconductor device also comprises a third eutectic bonding material disposed between the first substrate and the second substrate and separate from the first eutectic bonding material and the second eutectic bonding material, the third eutectic bonding material comprising the first eutectic component. The first eutectic bonding material and the second eutectic bonding material bond the first substrate to the second substrate.

In accordance with yet another embodiment, a semiconductor device comprises a passivation layer over a first substrate, a second substrate, and a eutectic bonding material bonding the first substrate to the second substrate. The eutectic bonding material comprises a first portion comprising a first concentration of a first eutectic component and a second concentration of a second eutectic component and a second portion comprising a third concentration of the first eutectic component and a fourth concentration of the second eutectic component, wherein the third concentration is different from the first concentration and the fourth concentration is different from the second concentration. The semiconductor device also comprises a block separated laterally from the eutectic bonding material, the block comprising the first eutectic component.

Although the present embodiments and their advantages have been described in detail, it should be understood that various changes, substitutions and alterations can be made herein without departing from the spirit and scope of the disclosure as defined by the appended claims. For example, many of the methods of formation discussed above can be changed or modified as desired while remaining within the scope of the embodiments. As another example, it will be readily understood by those skilled in the art that the various materials utilized be varied while still remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a first substrate;
   a second substrate;
   a eutectic bonding material interposed between the first substrate and the second substrate, the eutectic bonding material comprising:
      an initiating portion with a first proportion of a first eutectic component and a second eutectic component; and
      a halting portion surrounding the initiating portion, the halting portion having a second proportion of the first eutectic component and the second eutectic component that is different from the first proportion; and
   a block laterally separated from the eutectic bonding material, wherein the block comprises the first eutectic component;
   wherein the eutectic bonding material bonds the first substrate and the second substrate.

2. The semiconductor device of claim 1, wherein the initiating portion has a larger proportion of the second eutectic component than the halting portion.

3. The semiconductor device of claim 1, wherein the first substrate comprises a passivation layer.

4. The semiconductor device of claim 3, wherein the first substrate comprises at least one trench formed within the passivation layer.

5. The semiconductor device of claim 4, wherein the at least one trench has a depth of between about 0.5 μm and about 40 μm.

6. The semiconductor device of claim 5, wherein the eutectic bonding material is at least partially located within the at least one trench.

7. The semiconductor device of claim 1, wherein the first eutectic component comprises aluminum and the second eutectic component comprises germanium.

8. The semiconductor device of claim 1, wherein the eutectic bonding material forms an electrical connection between the first substrate and the second substrate.

9. A semiconductor device comprising:
- a first eutectic bonding material disposed between a first substrate and a second substrate, the first eutectic bonding material having a first composition comprising a first eutectic component and a second eutectic component;
- a second eutectic bonding material adjacent the first eutectic bonding material, the second eutectic bonding material having a second composition comprising the first eutectic component and the second eutectic component, wherein the second composition is different from the first composition; and
- a third eutectic bonding material disposed between the first substrate and the second substrate and separate from the first eutectic bonding material and the second eutectic bonding material, the third eutectic bonding material comprising the first eutectic component.
- wherein the first eutectic bonding material and the second eutectic bonding material bond the first substrate to the second substrate.

10. The semiconductor device of claim 9, further comprising a fourth eutectic bonding material disposed between the first substrate and the second substrate and separate from the third eutectic bonding material, the fourth eutectic bonding material comprising the first eutectic component.

11. The semiconductor device of claim 9, wherein the first eutectic component comprises gold and the second eutectic component comprises silicon.

12. The semiconductor device of claim 9, wherein the first eutectic bonding material forms an electrical connection between the first substrate and the second substrate.

13. A semiconductor device comprising:
- a passivation layer over a first substrate;
- a second substrate;
- a eutectic bonding material bonding the first substrate to the second substrate, the eutectic bonding material comprising:
  - a first portion comprising a first concentration of a first eutectic component and a second concentration of a second eutectic component; and
  - a second portion comprising a third concentration of the first eutectic component and a fourth concentration of the second eutectic component, wherein the third concentration is different from the first concentration and the fourth concentration is different from the second concentration; and
- a block separated laterally from the eutectic bonding material, the block comprising the first eutectic component.

14. The semiconductor device of claim 13, wherein the block is a first block in a plurality of blocks.

15. The semiconductor device of claim 14, wherein the plurality of blocks is arranged in a row.

16. The semiconductor device of claim 13, wherein the block is shaped to surround the eutectic bonding material.

17. The semiconductor device of claim 13, wherein the passivation layer comprises a trench.

18. The semiconductor device of claim 17, wherein the eutectic bonding material is at least partially located within the trench.

19. The semiconductor device of claim 13, wherein the first concentration is less than the third concentration.

20. The semiconductor device of claim 13, further comprising a second block removed from the eutectic bonding material, the second block comprising the second eutectic component.

* * * * *